United States Patent [19]

Caiaffa

[11] Patent Number: 5,764,702
[45] Date of Patent: Jun. 9, 1998

[54] RECOVERY OF TIMING SIGNALS

[75] Inventor: Carlo Caiaffa, Charenton, France

[73] Assignee: Valeo Electronique, Creteil Cedex, France

[21] Appl. No.: 524,229

[22] Filed: Sep. 6, 1995

[30] Foreign Application Priority Data

Sep. 7, 1994 [FR] France ............... 94 10720

[51] Int. Cl.⁶ ............... H03B 5/26; H03D 27/06
[52] U.S. Cl. ............... 375/316; 375/354; 455/345; 455/352; 331/141
[58] Field of Search ............... 375/200, 316, 375/326–328, 354, 355, 362, 364, 377; 331/138, 142, 172, 187; 327/84, 587; 455/345, 332

[56] References Cited

U.S. PATENT DOCUMENTS

| | | | |
|---|---|---|---|
| 3,873,943 | 3/1975 | Reijnders | 331/141 |
| 4,449,247 | 5/1984 | Waschka, Jr. | 455/9 |
| 4,592,071 | 5/1986 | Prigent | 375/269 |
| 4,996,444 | 2/1991 | Thomas et al. | 327/165 |
| 5,047,735 | 9/1991 | Meline | 331/117 |

FOREIGN PATENT DOCUMENTS

| | | |
|---|---|---|
| 0 123 587 | 10/1984 | European Pat. Off. . |
| 2200676 | 4/1974 | France . |

OTHER PUBLICATIONS

French Search Report dated 12 Jun. 1995.

*Primary Examiner*—Stephen Chin
*Assistant Examiner*—Amanda T. Le
*Attorney, Agent, or Firm*—Morgan & Finnegan, LLP

[57] ABSTRACT

The device for the recovery of a timing signal comprises a oscillator (3) which includes an amplifier (4); a first impedance (Z1) connected between a first input and the output of the amplifier and a second impedance (Z2) also connected between the first input of the amplifier and ground. A third resistive impedance (R1) is connected between a second amplifier input and the amplifier output. A fourth resistive impedance (R2) is connected between the second amplifier input and an injection point of a voltage that corresponds the signal from which the timing signal is to be recovered.

10 Claims, 4 Drawing Sheets

RECOVERY OF TIMING SIGNALS

FIELD OF THE INVENTION

The present invention relates to timing signal recovery devices. It also relates to remote control receivers intended to be used in a motor vehicle environment or the like, and also to transmission devices comprising such receivers and the radio frequency signals used by these receivers.

BACKGROUND TO THE INVENTION

A signal for radio frequency transmission is conventionally a carrier modulated by a baseband signal or audio signal having a frequency of less than 15 kHz.

After receiving and mixing with the recovered carrier, the signal at the receiver's disposal is the baseband signal, on which the receiver has to perform a timing signal recovery.

Timing signal recovery is conventionally performed by means of a phase locked loop using a voltage-controlled oscillator and a mixer.

The phase locked loops are nevertheless too burdensome for certain applications related to motor vehicles.

One object of the invention is to propose a signal recovery device which does not use a phase locked loop.

In this respect it has been discovered that by modifying the construction of a Wien bridge oscillator in a simple manner, and in particular by applying to a terminal of one of the impedances of the bridge the signal for which it is wished to recover the timing signal, even though this terminal is normally connected to ground, this recovery could be ensured in an extremely simple and economical manner.

SUMMARY OF THE INVENTION

According to a first aspect of the present invention there is provided a device for the recovery of a timing signal of a given frequency from an input signal having a spectrum spread on either side of this frequency, wherein the device comprises a modified Wien bridge oscillator including:

an amplifier, a first impedance connected between a first input and the output of the amplifier, a second impedance connected between the first input of the amplifier and a reference potential, a third impedance of an essentially resistive type connected between a second input of the amplifier and the output of the amplifier, and a fourth impedance of an essentially resistive type connected between the second input of the amplifier and an injection point for the input signal.

The amplifier is preferably an operational amplifier, its first input being its non-inverting input and its other input being its inverting input.

According to a second aspect of the present invention there is provided a remote control receiver intended to be used in a motor vehicle environment or the like. The receiver also is intended to receive and to process a radio frequency signal which is a baseband modulated carrier. The receiver receiver comprising means for the recovery of the baseband signal, means for the recovery of a timing signal from the baseband signal, and a central processing unit to which the baseband signal and the recovered timing signal are transmitted, wherein the means for the recovery of the timing signal include a recovery device in accordance with the first aspect.

According to a third aspect of the present invention there is provided a radio frequency transmission device intended to be used in a motor vehicle environment or the like. The transmitter for the transmission of a radio frequency signal is a baseband modulated carrier and a radio frequency receiver intended to receive and to process this signal. The the receiver is a receiver in accordance with the second aspect of the invention, and wherein the baseband signal has a spectrum spread around the resonant frequency of the oscillator of the timing signal recovery device of the said receiver.

The baseband signal is advantageously a signal which assumes at least two states and which is a succession of binary signals of time interval 2T each formed:

by a portion of time interval T which bears the binary coding, by a synchronisation portion of time interval T which is identical from one binary signal to another and which includes two parts staggered on either side of the portion of time interval T which bears the binary coding.

By "staggered" it is understood that these two parts correspond to states or sequences of states of distinct signal (s), which guarantees transitions of numerous signals.

More particularly, the portion of time interval T which bears the binary coding is advantageously formed:

for a first binary value, by a signal which assumes a first state during a time interval $\alpha T$, a being between 0 and 1 and being different from 0, from 1 and from ½, then a second state during a time interval $(1-\alpha)T$, for a second binary value, by a signal which assumes the first state during a time interval $(1-\alpha)T$, then the second state during a time interval $\alpha T$.

According to a particularly preferred embodiment, $\alpha$ is equal to ⅓.

Also in an advantageous manner, the synchronisation portion of time interval T is formed:

for its first part by a signal which assumes the second state during a time period $\beta T$, $\beta$ being between 0 and 1 and being different from 0 and 1, for its second part by a signal which assumes the first state during a time period $(1-\beta)T$.

In that case $\beta$ is preferably equal to ½.

BRIEF DESCRIPTION OF THE INVENTION

Other characteristics and advantages of the invention will also become apparent from the following description. This description is purely illustrative and not restrictive. It should be read with reference to the attached drawings on which:

DESCRIPTION OF THE PREFERRED EMBODIMENTS

Figure 1:
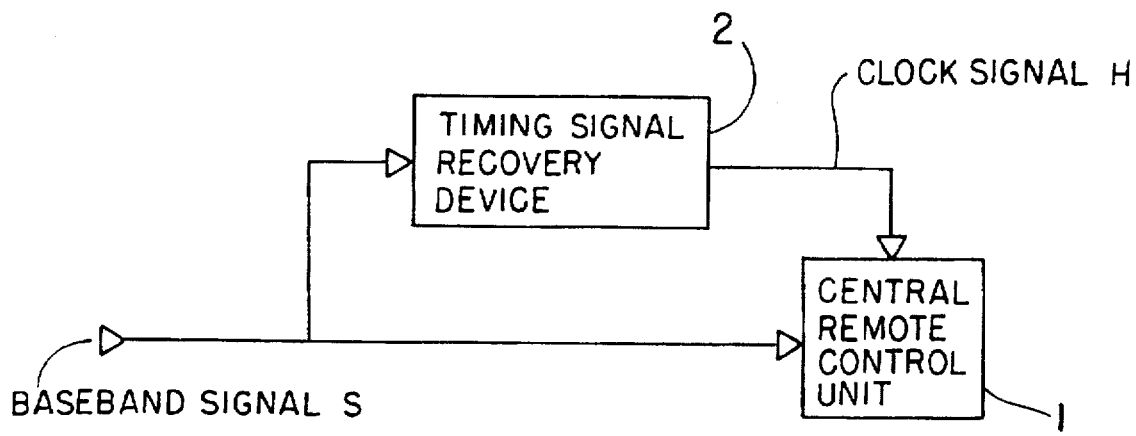
FIG. 1 is a block diagram illustrating the application of the invention.

FIG. 1 shows a central remote control unit 1 intended to receive a baseband signal S, recovered after mixing the signal received with a carrier. This signal S is also received by a timing signal recovery device 2 which sends to the central unit 1 a clock signal H enabling it to regenerate binary information borne by the signal S.

Figure 2:
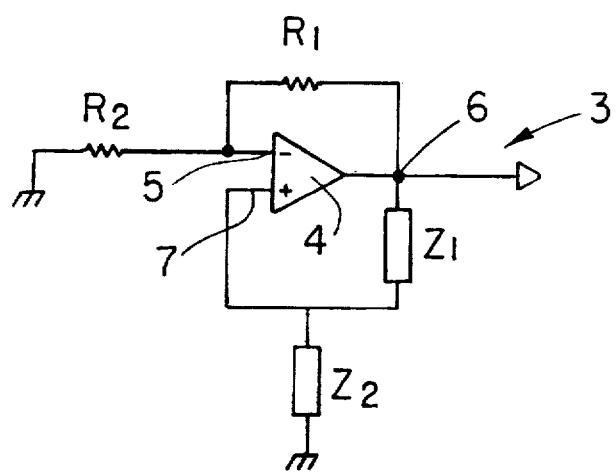
FIG. 2 is a diagrammatical representation forming part of a recovery device in accordance with the invention.

The recovery device 2 more particularly comprises an oscillator 3 as represented on FIG. 2.

This oscillator 3 comprises an operational amplifier 4, the inverting input 5 of which is connected to one end of a resistor R2. A logic voltage (between 0 and 5 Volts) corresponding to the baseband signal S is imposed at the other end of this resistor R2.

A resistor R1 is also in feedback configuration between this inverting input 5 and the output 4 of the amplifier 6.

The non-inverting input 7 of the amplifier 4 is in turn connected to one end of an impedance Z2, the other end of which is connected to ground.

The non-inverting input 7 of the amplifier 4 is also connected by an impedance Z1 to its output 6.

It will be noted that the structure represented in FIG. 2 does not form a conventional Wien bridge oscillator since the resistor R2 is not connected to ground.

Surprisingly, even though for this reason one could expect this structure not to oscillate, the applicant has noted that this structure enabled the recovery of a timing signal of frequency $F_0$ from a signal having a spread of frequencies between $F_0+DF$ and $F_0-DF$.

Figure 3A:
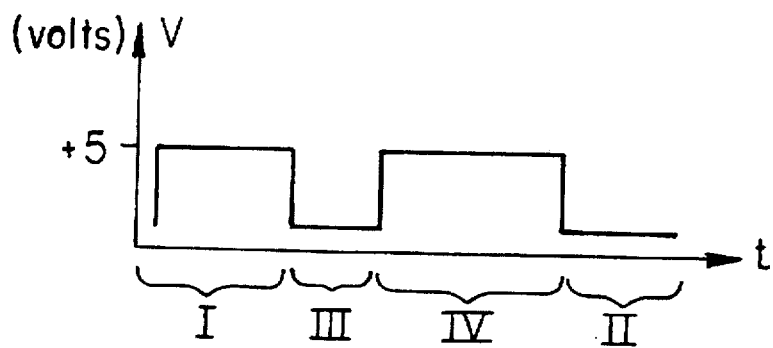
FIGS. 3a to 3b represent signals of binary value 0 and 1 used by the invention.
Figure 3B:
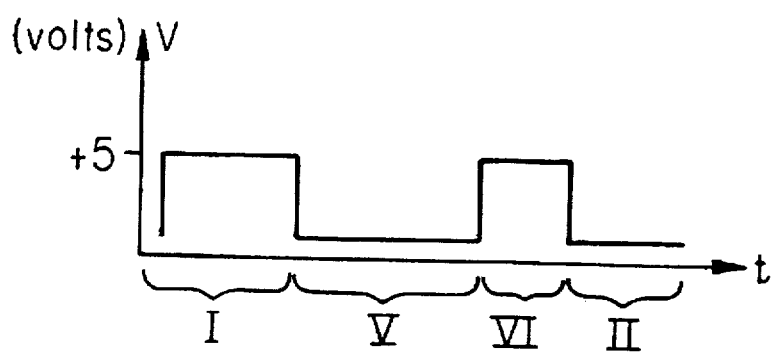

In particular, the structure proposed by the invention is advantageously used with an input signal which is a sequence of binary signals of the type of those represented on FIGS. 3a and 3b.

The signal of FIG. 3a corresponds for example to the binary value "0"; the signal of FIG. 3b corresponds to the binary value "1".

Each of these bits extends over a time interval 2T.

The signal of FIG. 3a successively assumes:

the value +V during a time interval equal to T/2 (part I), the value 0 during a time interval equal to T/3 (part III), the value +V again during a time interval equal to 2T/3 (part IV), the value 0 again during a time interval equal to T/2 (part II).

The signal of FIG. 3b successively assumes:

the value +V during a time interval equal to T/2 (part I)

the value 0 during a time interval equal to 2T/3 (part V), the value +V during a time interval equal to T/3 (part VI), the value 0 during a time interval equal to T/2 (part II).

The first and the last parts of each bit (parts I and II) are identical from one bit to another. It is the central portion of the bits (parts III and IV or parts V and VI) which contains the binary information.

When a signal composed of a succession of configured binary signals, as represented on FIGS. 3a and 3b, is sent to the input of the oscillator 3 (FIG. 2), the signal at the output of the amplifier 4 of this oscillator 3 is a pure periodic signal of frequency $F_0=1/T$.

Of course, the values of the resistors R1 and R2, and also of the impedances Z1 and Z2 are chosen so that the frequency $F_0$ corresponds to the resonant frequency of the oscillator 3.

Figure 3C:
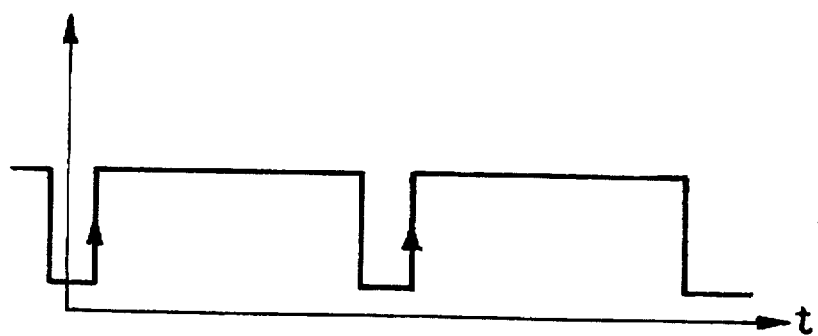
FIG. 3c represents the timing signal used by the invention for the regeneration of the binary information.

This timing signal is processed by the unit 1 in order to provide the regeneration signal of the binary information represented on FIG. 3c.

The binary value "0" or "1" of each bit of the baseband signal received is obtained, every 2T, at the rising edges of the signal of FIG. 3c, by using regeneration means conventionally known to the person skilled in the art.

Figure 4:
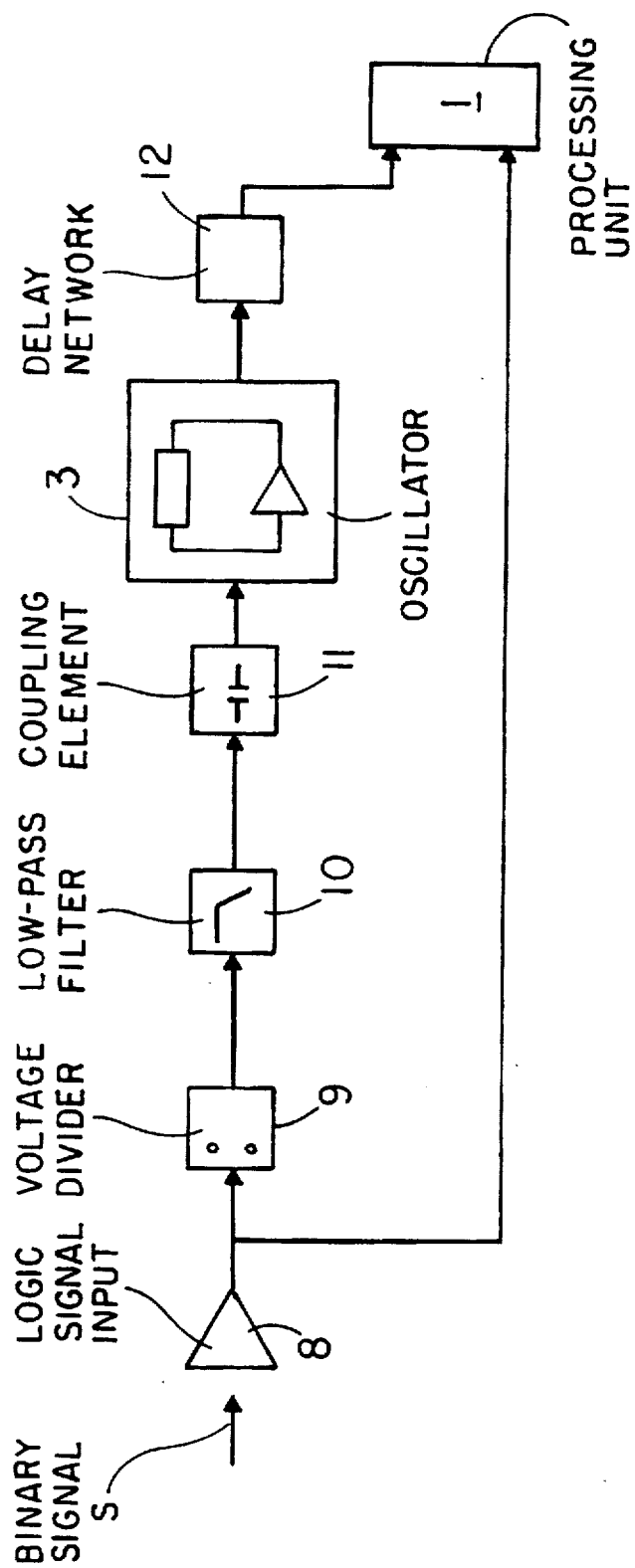
FIG. 4 represents a recovery device in accordance with the invention.

The recovery device 2 is completely shown on FIG. 4. Besides the oscillator 3 it includes:

a logic signal input 8 (signal 0/5 Volts corresponding to the baseband signal), a voltage divider 9 connected to the input 8, a low-pass filter 10 connected at the output of this voltage divider 9, a coupling element 11 connected to the low-pass filter 10 and performing the injection of the signal at the input of the oscillator 3, a delay network 12 between the oscillator 3 and the processing unit 1 to which the signal received at the input 8 is sent in parallel.

The voltage divider 9 and the low-pass filter 10 serve to condition the logic signal.

The oscillator 3, centred at the frequency $F_0=1/T$, performs the recovery of the frequency and of the phase of the baseband signal.

The delay network 12 serves to cancel, at the input of the unit 1, any phase error between the binary signal S and the timing signal at the output of the oscillator 3.

Figure 5:
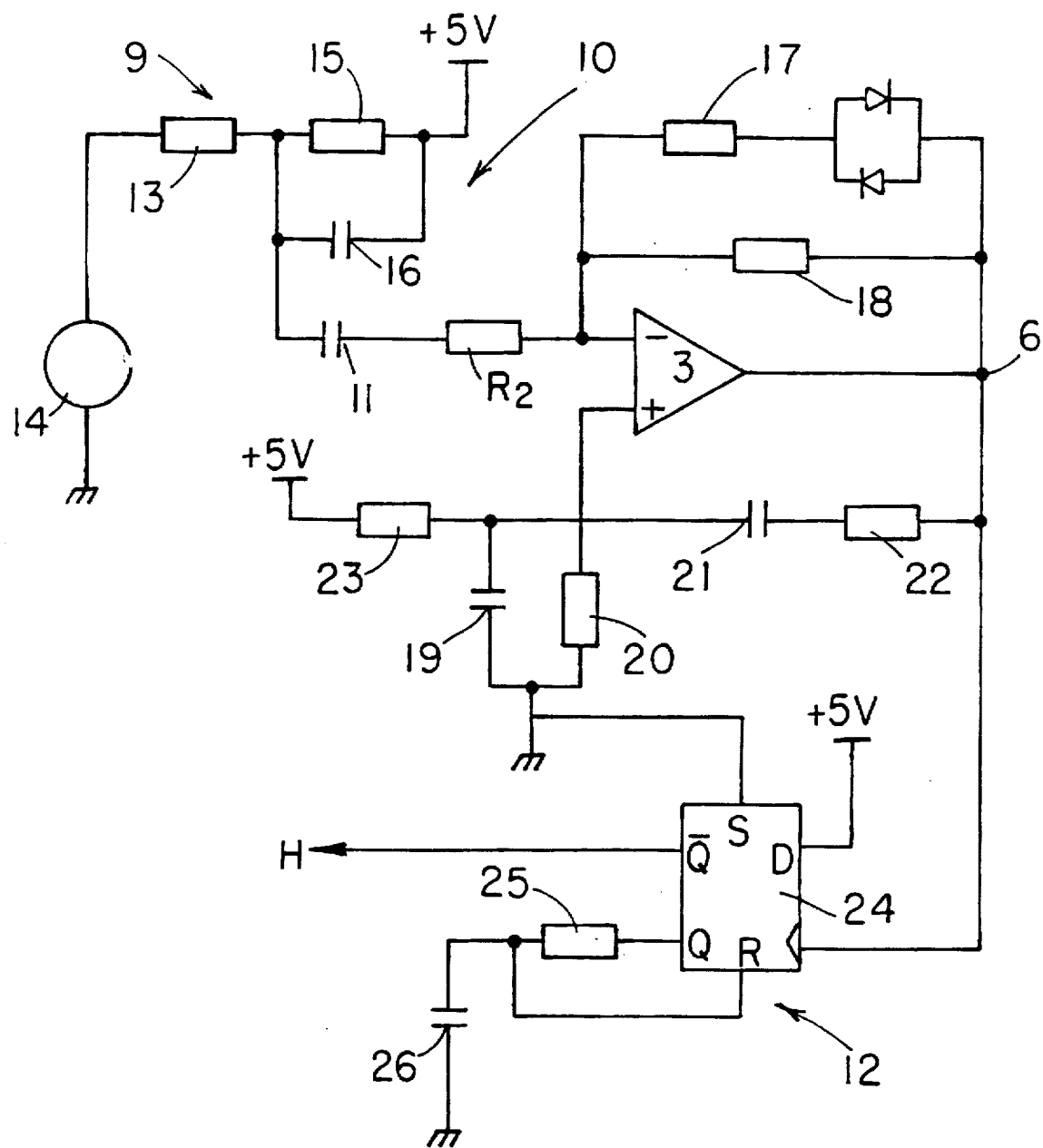
FIG. 5 is the diagram of an exemplified embodiment for the device of FIG. 4.

A particular configuration example has been shown on FIG. 5.

On this configuration, the voltage divider 9 comprises a resistor 13 of 110 kOhms at one end of which the voltage corresponding to the logic signal is imposed (source 14 of low impedance). This resistor 13 is connected by its other end to a resistor 15 of 350 kOhms, which is supplied at its opposite end with a voltage of +5 Volts.

The low-pass filter is formed by a capacitor 16, the capacitance value of which is 470 pF.

This capacitor 16 is connected in parallel with the resistor 15 between the supply voltage of 5 volts and the resistor 13.

The node on which the resistors 13 and 15 and also the capacitor 16 are mounted, is also connected to a capacitor which forms the coupling element and the capacitance value of which is 100 nF.

At its other end, this capacitor 11 is connected in series with the resistor R2, the value of which is 24 kOhms.

The resistor R1 is formed by two resistors 17 and 18 connected in parallel, the resistor 17 being 470 kOhms and the resistor 18 being 220 kOhms.

The operational amplifier 3 is of the type TLC 271.

The non-inverting input of this amplifier 3 is connected, firstly, to a resistor 20 of 160 kOhms, connected to ground and connected in parallel with a capacitor 19, the capacitance value of which is 1 nF.

The non-inverting input is also connected to a capacitor 21, the capacitance value of which is 1 nF and which is connected in series with a resistor 22 of 43 kOhms.

This non-inverting input is furthermore connected to a resistor 23 of 160 kOhms, the opposite end of which is supplied by a voltage of +5 Volts.

The output 6 of the amplifier 3 is in turn connected to the end of the resistor 22, which is opposite the capacitor 21.

This output 6 is also connected to the clock input of a bistable circuit RS, bearing the reference 24 on FIG. 5. The input S of this bistable circuit 24 is connected to ground. The output Q of the bistable circuit 24 is connected by a resistor of 25 kOhms to its input R, this input R being connected to a capacitor 26, the opposite end of which is connected to ground. The Q-bar output supplying the timing signal extracted is delayed.

Of course, other configurations are possible, in particular in order to perform the delaying function or to perform processing prior to the injection.

The specific characteristics of this configuration are as follows, for a transmission rate of 1 Kbit/s:

$F_o=1/T=2$ kHz (T=250 μs, Td=75 μs, Tp=85 μs 1/−30%)

d=division ratio of the voltage divider 9=4.3

$F_c$=cut-off frequency of the low-pass filter 10=4 KHz

C=value of the coupling capacitance 11=100 μF $T_d$=delay of the network 12=75 μs.

I claim:

1. A device for the recovery of a timing signal of a given frequency from an input signal having a spectrum spread on either side of this frequency, wherein the device comprises a Wien bridge oscillator including:

an amplifier, a first impedance mounted between a first input and an output of the amplifier, a second impedance connected between the first input of the amplifier and a reference potential, a third impedance of an essentially resistive type connected between a second input of the amplifier and the output of the amplifier, and a fourth impedance of an essentially resistive type connected between the second input of the amplifier and an injection point for the input signal.

2. A device according to claim 1, wherein the amplifier is an operational amplifier, the first input being its non-inverting input and the second input being its inverting input.

3. A remote control receiver intended to be used in a motor vehicle environment and intended to receive and to process a radio frequency signal which is a baseband modulated carrier, this receiver comprising means for the recovery of the baseband signal, means for the recovery of a timing signal from the baseband signal, a central processing unit to which the baseband signal and the recovered timing signal are transmitted, wherein the means for the recovery of the timing signal include a device as claimed in claim 1.

4. A receiver according to claim 3, comprising at the output of the oscillator, a delay network for changing the phase of the timing signal so that it corresponds to the signal at the input to the central processing unit.

5. A radio frequency transmission device intended to be used in a motor vehicle environment comprising a transmitter for the transmission of a radio frequency signal which is a baseband modulated carrier and a radio frequency receiver intended to receive and to process this signal, wherein the receiver is a receiver as claimed in claim 4, and wherein the baseband signal has a spectrum spread around the resonant frequency of the oscillator of the timing signal recovery device of the receiver.

6. A device according to claim 5, wherein the baseband signal is a signal which assumes at least two states and which is a succession of binary signals of time interval 2T each formed:

by a portion of time interval T which bears the binary coding, by a synchronisation portion of time interval T which is identical from one binary signal to the other and which comprises two parts (I, II) staggered on either side of the said portion of time interval T which bears the binary coding.

7. A device according to claim 6, wherein the portion of time interval T which bears the binary coding is formed:

for a first binary value by a signal which assumes a first state during a time interval $\alpha T$, $\alpha$ being between 0 and 1 and being different from 0, from 1 and from ½, then a second state during a time interval $(1-\alpha)T$, for a second binary value, by a signal which assumes the first state during a time interval $(1-\alpha)T$ and the second state during a time interval $\alpha T$.

8. A device according to claim 7, wherein $\alpha$ is equal to ⅓.

9. A device according to claim 6, wherein the synchronization portion of time interval T is formed:

for its first part by a signal which assumes the second state during a time interval $\beta T$, $\beta$ being between 0 and 1 and being different form 0 and 1, for its second part by a signal which assumes the first state during a time interval $(1-\beta)T$.

10. A device according to claim 9, wherein $\beta$ is equal to ½.

* * * * *